METHOD OF FORMING HIGH STABILITY, SELF-REGISTERED FIELD EFFECT TRANSISTORS
Filed Dec. 8, 1969

INVENTORS:
JAMES F. BURGESS,
CONSTANTINE A. NEUGEBAUER,
REUBEN E. JOYNSON
by [signature]
THEIR ATTORNEY INVENTORS:
JAMES F. BURGESS,
CONSTANTINE A. NEUGEBAUER,
REUBEN E. JOYNSON
by [signature]
THEIR ATTORNEY INVENTORS:
JAMES F. BURGESS,
CONSTANTINE A. NEUGEBAUER,
REUBEN E. JOYNSON
by
THEIR ATTORNEY United States Patent Office 3,614,829
Patented Oct. 26, 1971

3,614,829

METHOD OF FORMING HIGH STABILITY, SELF-REGISTERED FIELD EFFECT TRANSISTORS

James F. Burgess and Constantine A. Neugebauer, Schenectady, and Reuben E. Joynson, Scotia, N.Y., assignors to General Electric Company Filed Dec. 8, 1969, Ser. No. 883,168
Int. Cl. B01j *17/00*; H01g *13/00*
U.S. Cl. 29—571 8 Claims

ABSTRACT OF THE DISCLOSURE

High stability, self-registered field effect transistors are formed by etching the metal gate electrode simultaneously with exposure of surface adjacent areas of a semiconductive wafer, growing an activator containing glass atop only the exposed areas of the wafer by passing a gaseous stream containing a mild oxidizing agent and an activator impurity across the etched face of the wafer heated to a temperature between 700° C. and 1000° C., and subsequently baking the semiconductive wafer in a reducing atmosphere at temperatures in excess of 1000° C. to form the source and drain regions of the semiconductive wafer. In a particularly preferred embodiment, a gaseous stream containing 5–10% hydrogen and 90–95% helium or argon is bubbled through water and ethyl borate solutions at room temperature whereupon the stream is passed over an etched wafer to form a silico-borate glass atop the exposed silicon surface. The semiconductive wafer then is baked for approximately 4 hours at 1000° C. in a nitrogen atmosphere containing 5–10% by volume hydrogen to drive the activator impurities into the wafer. A technique for forming complementary pairs of high stability self-registered field effect transistors on a single substrate also is disclosed.

Figure 1:
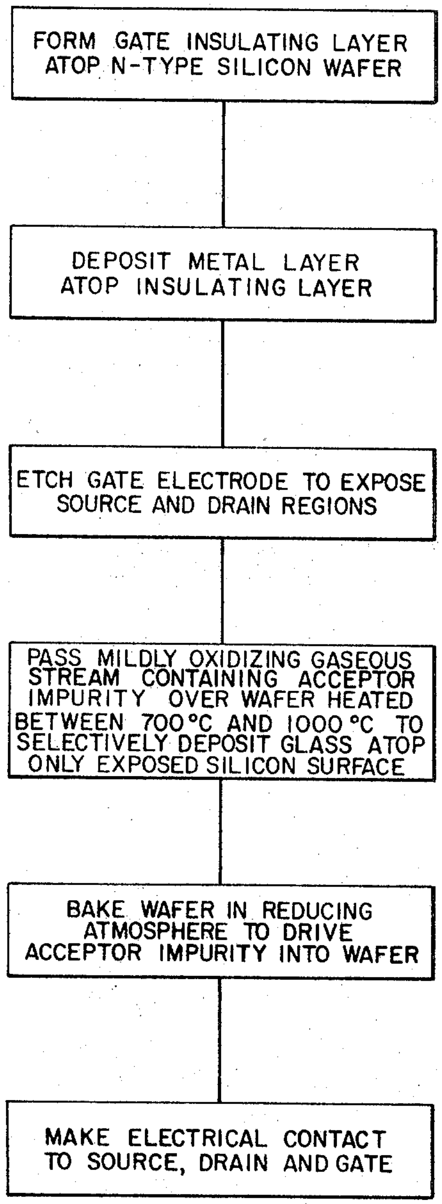

This invention relates to a method of forming a highly stable self-registered field effect transistor and, more particularly, to a method of forming the transistor by the low temperature deposition of an activator containing glass atop only the desired source and drain regions of a gate electrode shielded semiconductive wafer and the subsequent diffusion of the activator into the source and drain regions by baking the wafer at high temperatures in a reducing atmosphere.

Among the more desirable methods for forming insulated gate field effect transistors is the self-registered gate technique wherein automatic gate-channel registration is achieved by etching the gate electrode simultaneously with the exposure of the desired source and drain regions of the semiconductive wafer. The gate electrode then serves as a mask during subsequent doping of the source and drain regions by techniques such as heating the wafer to a temperature of approximately 1000° C. in an activator impurity containing atmosphere (as disclosed in Brown et al. U.S. application Ser. No. 675,228, filed Oct. 13, 1967, now Pat. No. 3,566,517, and assigned to the assignee of the present invention) or by pyrolytically depositing an activator impurity containing glass atop the entire etched surface of the semiconductive wafer and subsequently baking the wafer to diffuse the activator impurity into the underlying source and drain regions (as disclosed in Brown et al. U.S. patent application Ser. No. 679,957, filed Oct. 13, 1967 and assigned to the assignee of the present invention). Unless conditions are precisely controlled during formation of the self-registered gate transistor, the transistor can exhibit drifts during subsequent temperature cycling with an electrical stress across the oxide. Among the factors we have found tending to produce instability in the self-registered gate transistor are prolonged subjection of the semiconductive wafer to temperatures in excess of 1000° C. in a vacuum environment and the tendency for boron to diffuse through the gate electrode into the underlying insulator when the entire surface of the gate electrode shielded semi-conductive wafer is coated with a boron doped pyrolytic glass.

It is therefore an object of this invention to provide a method of producing a highly stable self-registered gate field effect transistor.

It is also an object of this invention to provide a self-registered gate field effect transistor relatively immune to contamination of the gate insulator during diffusion of conductivity inducting impurities into the source and drain regions.

It is also an object of this invention to provide a method of producing a self-registered gate field effect transistor wherein baking of the semiconductive wafer at temperatures in excess of 1000° C. is conducted only in a reducing atmosphere.

It is also an object of this invention to provide a novel method of forming high stability complementary field effect transistors.

These and other objects of this invention generally are achieved by selectively depositing an activator impurity containing glass atop only the desired source and drain regions of a gate electrode shielded semiconductive wafer heated to a temperature between 700° C. and 1000° C. and subsequently driving the activator impurity into the wafer at a temperature above 1000° C. in a reducing atmosphere. Thus, the method of forming a self-registered gate transistor in accordance with this invention includes the formation of a gate insulating layer and an overlying electrically conductive film atop one major surface of a semiconductive body of first conductivity type whereupon selective portions of the electrically conductive film and underlying insulating layer are removed to expose surface adjacent regions of the semiconductive body. The semiconductive body then is heated to a temperature between 700° C. and 1000° C. and a mildly oxidizing gaseous stream containing an activator-inducing impurity is passed over the heated semiconductive body to react with the exposed areas of the semiconductive body thereby forming an activator rich glass only atop the exposed areas with oxidation of the electrically conductive film being inhibited by the reduced oxygen content of the stream, e.g. the stream should produce an oxide layer less than 100 A. thick atop the shielding gate electrode. The semiconductive body then is removed from the mildly oxidizing gaseous stream and baked in a reducing atmosphere at a temperature in excess of 1000° C. to diffuse the activator-inducing impurity into the semiconductive body and form source and drain regions of opposite conductivity type in the wafer. Electrical contact then is made both to the electrically conductive film and the source and drain regions of the semiconductive wafer to complete the field effect transistor.

Figure 2:
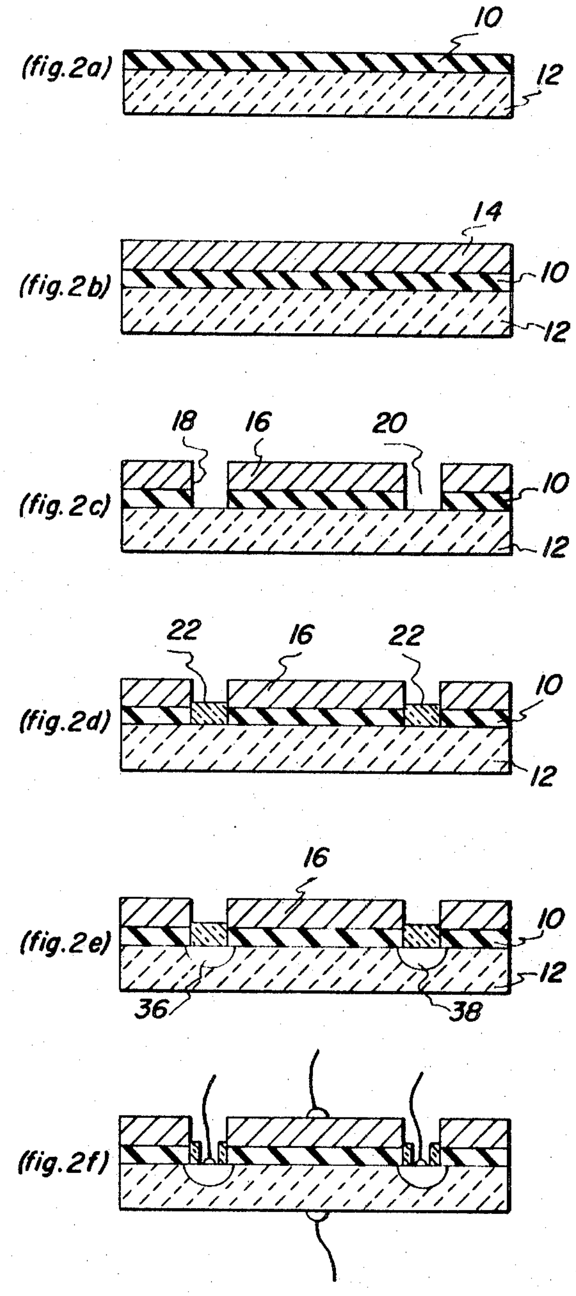
Figure 3:
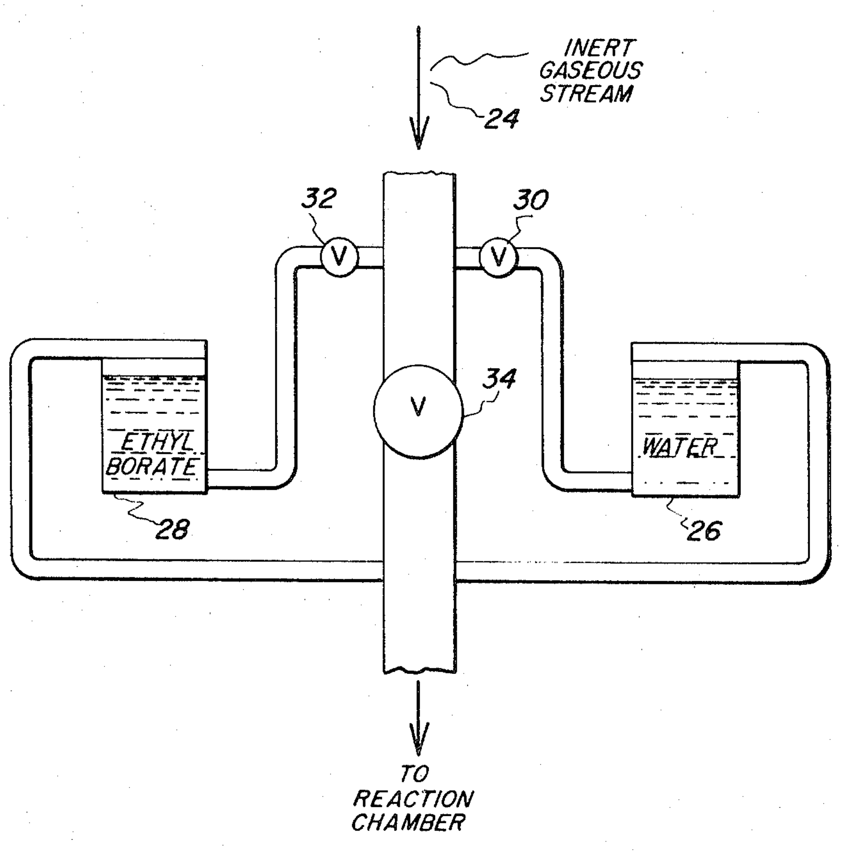

The novel features believed characteristic of the invention are set forth in the appended claims. The invention itself, together with further objects and advantages thereof may best be understood by reference to the following description, taken in connection with the accompanying drawings, in which:

FIG. 1 is a flow chart illustrating in block diagram form the method of forming high stability, self-registered field effect transistors in accordance with this invention, FIG. 2 is a pictorial illustration depicting in cross-sectional view the process for fabricating a field-effect transistor in accordance with this invention, FIG. 3 is a flow diagram of a preferred method of forming a mildly oxidizing stream for selectively depositing activator doped glass atop the transistor.

Figure 4:
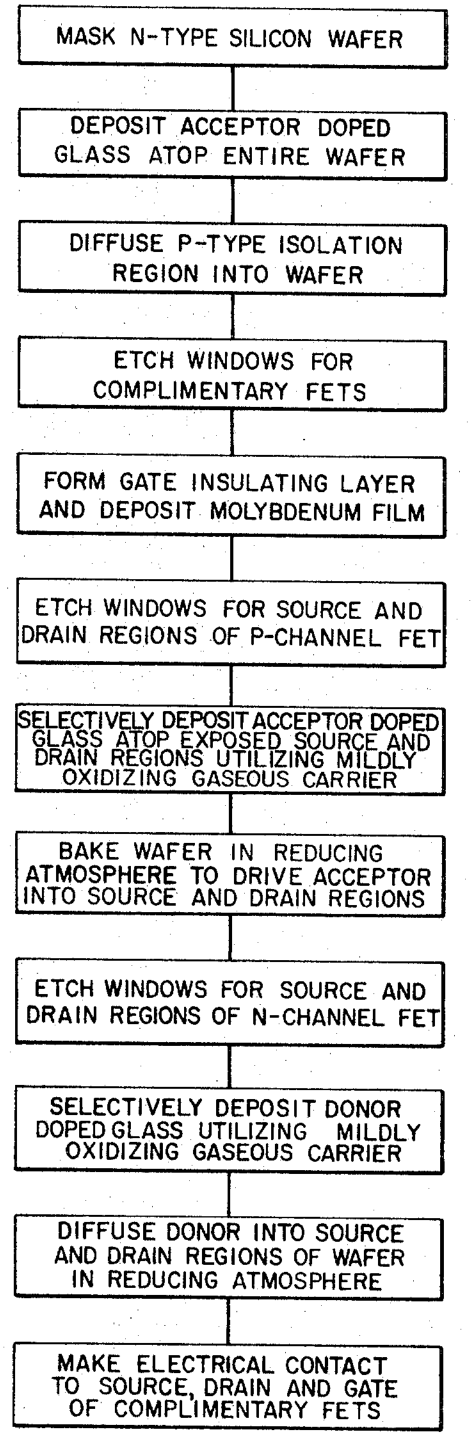
Figure 5:
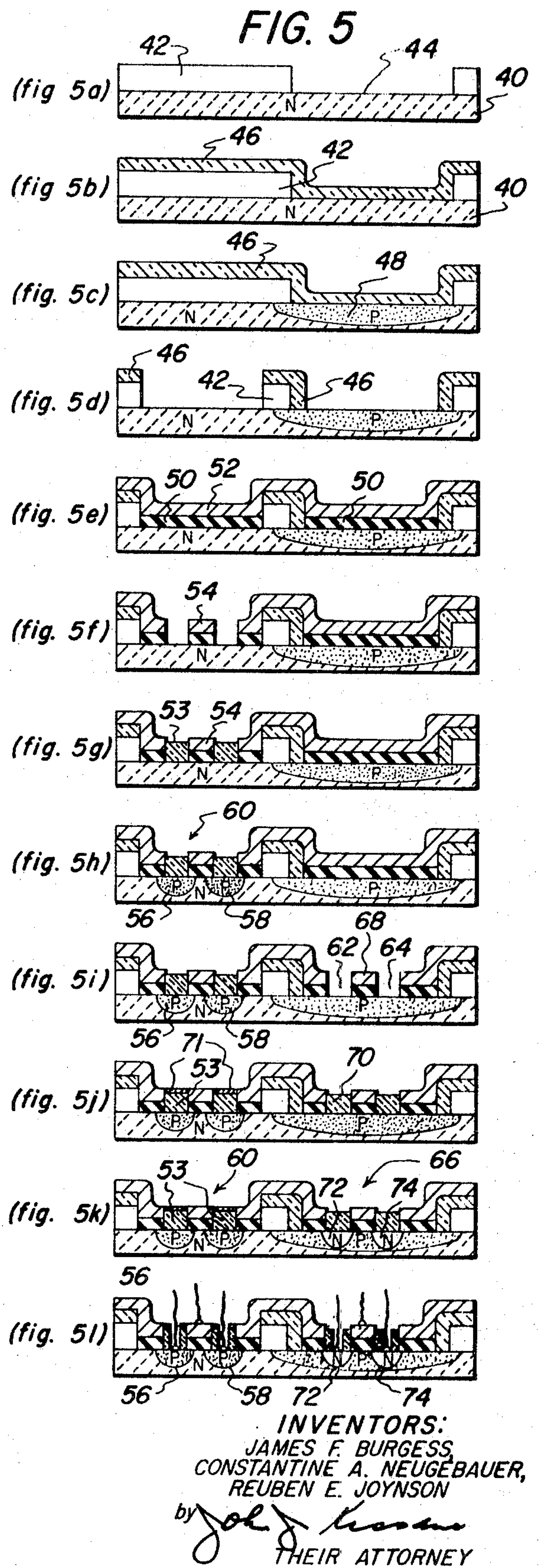

FIG. 4 is a flow chart illustrating in block diagram form the method of forming complementary transistors in accordance with this invention, and FIG. 5 is a pictorial illustration depicting in cross-sectional view the process for fabricating complementary field effect transistors in accordance with this invention.

The formation of a high stability self-registered gate field effect transistor in accordance with this invention is depicted in FIGS. 1 and 2 and initially comprises the formation of a gate insulating layer 10, illustrated in FIG. 2A, atop a suitable semiconductive body, e.g. a (100) or (111) monocrystalline silicon wafer 12 doped to an N-type resistivity of 1–10 ohm-centimeter. Typically the wafer is between 10 to 15 mils thick and may contain approximately $10^{16}$–$10^{17}$ atoms per cc. of phosphorus to achieve the suitable n-type conductivity therein. Although this invention is specifically described hereinafter by the formation of a silicon field effect transistor because of the ability of silicon to form high quality glass at temperatures between 700° C. and 1000° C., other semiconductive materials, such as germanium, capable of forming a glass at temperatures below 100° C. in a midly oxidizing atmosphere also can be employed in the practice of this invention. Preferably insulating layer 10 is formed atop silicon wafer 12 by baking the wafer at a temperature between 1000 and 1200° C. in a dry oxygen atmosphere for approximately 1–2 hours. A suitable thickness for a silicon dioxide thermally grown insulating layer is approximately 1200 A. (which thickness can be produced by baking the silicon wafer for 2 hours at 1050° C. in a flowing dry oxygen stream) although any film thickness within a range between 400 A. and 2000 A. generally can be employed dependent upon the transistor characteristics desired.

In some instances it may be preferable that a portion of the gate insulating film be comprised of another insulating material, e.g. silicon nitride because of the greater resistance of silicon nitride to diffusion of conventional donor and acceptor atoms therethrough. The silicon nitride film, if desired, may be suitably formed by reacting $SiH_4$ and $NH_3$ at a temperature of 1000° C. at the surface of an uncoated or thin oxide coated silicon wafer. Such a process suitably utilizes a partial pressure of 0.015 torr $SiH_4$ in an atmosphere of ammonia and a 1000 A. thick film of silicon nitride is formed in approrimately 10 minutes. Alternately the gate insulating layer also may be formed of an amorphous compound of silicon, oxygen and nitrogen, generally referred to as silicon oxynitride, utilizing the techniques described in U.S. application Ser. No. 598,-305, filed Dec. 1, 1966 in the name of F. K. Heumann and assigned to the assignee of the present invention, i.e. by the pyrolytic decomposition of a silane, oxygen and ammonia at the surface of a silicon wafer maintained at a temperature of approximately 1000° C. to 1200° C.

After formation of an insulating layer 10, a thin metallic film of molybdenum, tungsten or other refractory material which is nonreactive with the adjacent insulating film is deposited atop the insulating layer. Typically the deposition of the refractory metal film, specifically described hereinafter as molybdenum film 14 illustrated in FIG. 2B, can be accomplished by conventional electron beam evaporation of a molybdenum source at a pressure of approximately $10^{-6}$ torr utilizing a six kilowatt electron beam gun to deposit molybdenum at the rate of 500 A. per minute atop the silicon wafer. The wafer is heated to a temperature of approximately 700° C. during deposition to enhance adhesion of the molybdenum film to the underlying oxide and deposition is continued until a molybdenum film between 700° A. and 5000 A. is deposited with molybdenum film thicknesses of approximately 4000° A. being typical. Other film forming techniques, such as sputtering or pyrolytic deposition of molybdenum from a molytetrachloride source, also could be employed to deposit molybdenum film 14, if desired.

Subsequent to the deposition of molybdenum film 14, the deposited film is patterned by conventional photolithic techniques to etch the gate electrode 16 for the field effect transistor, i.e. by coating the entire film with photoresist, selectively exposing the photoresist and subsequently dissolving the unexposed areas of the photoresist in a suitable photoresist developer. The masked wafer then is heated to a temperature of approximately 150° C. for 40 minutes to harden the photoresist whereupon the wafer is immersed in an etch comprising 100 cc. of sulfuric acid, 100 cc. of nitric acid and 300 cc. of water to etch the molybdenum exposed by the photolithic development of the photoresist. The photoresist mask thereupon is removed by immersing the structure in hot concentrated sulfuric acid.

After chemically removing the photoresist mask, the wafer is positioned as the target within a conventional R.F. sputtering chamber containing, for example, 100 microns of argon and an R.F. power of 200 w. is applied to the tarket to back sputter the exposed insulating layer from the surface of silicon wafer 12 utilizing gate electrode 16 as a shield to inhibit removal of the underlying gate oxide. Although some molybdenum also is removed during sputter etching of source and drain holes 18 and 20, respectively, the exposed oxide sputers at a rate approximately 5 fold the sputtering rate of the molybdenum thereby assuring a complete removal of the oxide at the source and drain locations while retaining sufficient conductivity in the molybdenum to serve as the gate electrode of the field effect transistor. The sidewalls formed by R.F. sputtering, as illustrated in FIG. 2*c*, are highly uniform and no undercutting of the gate electrode is produced contrary to conventional acid etch techniques for selectively removing the exposed oxide. If desired, however, conventional acid etch techniques may be employed utilizing a "buffered HF" etchant comprising one part concentrated HF and ten parts of a 40 percent solution of $NH_4F$ for a silicon dioxide gate insulator. When silicon nitride is utilized for gate insulating layer 10, an 85% solution of phosphoric acid utilized at 180° C. suitably may be employed for acid etching. Etching of the portion of insulating layer 10 exposed during the previous etch of gate electrode 16 produces source and drain holes 18 and 20, respectively, extending through the molybdenum film and insulating layer to the underlying silicon wafer to permit deposition of an activator-inducing impurity atop the silicon wafer.

After etching the source and drain holes, wafer 12 is heated to a temperature between 700° C. and 1000° C. and a mildly oxidizing gaseous stream carrying an acceptor activator impurity, e.g. an inert gas such as nitrogen, hydrogen or argon, containing water and ethyl borate in quantities producing less than a 100% saturation of the gas with the respective ingredients at room temperatures, is passed over the wafer to react with the exposed silicon thereby forming highly doped glass layer 22 in the source and drain regions as illustrated in FIG. 2D. Typically the desired concentration of activator impurity and humidity in the inert gaseous stream is achieved by the technique illustrated in FIG. 3, e. g. bubbling diverse portions of gaseous stream 24 at room temperature through water bath 26 and ethyl borate bath 28 with the percentage of the gas stream passing through water bath 26 being regulated by valve 30 to assure a minimum oxidation of the molybdenum gate.

The oxidizing agent carried by the insert gaseous stream should be present in quantities to form a glass layer between 100 A. and 5000 A. thick atop the exposed silicon while forming an oxide layer no greater than 100 A. thick atop the molybdenum gate electrode. Such thickness can be achieved utilizing water vapor as the mild oxidizing agent only when the insert gaseous stream is less than 100% saturated with water vapor at room temperature before being passed over the heated water. If desired, the chemically inert gaseous stream serving as the carrier can be bubbled through other mild oxidizing agents, e.g. $CH_3CH_2OH$, prior to passage of the gaseous stream over the wafer or a mildly oxidizing gas, such as carbon dioxide or carbon monoxide, can be added to the inert gaseous stream to selectively form the acceptor doped glass along the exposed source drain. A 1000 A. glass layer normally produces the desired 1–2.5 micron deep source and drain regions upon subsequent drive-in. In general, the glass formed atop the exposed silicon should exceed the thickness of the oxide formed atop the gate electrode by a factor of at least 10.

Preferably the inert gaseous stream utilized to form doped glass layer 22 also contains between 2 and 15% by volume hydrogen to assist in stabilizing the silicon wafer while inhibiting oxidation of the previously etched molybdenum gate. Particularly advantageous gaseous streams for the formation of glass layer consists of 90–95% by volume nitrogen, helium or argon with the remainder, i.e. 10–5%, of the stream being hydrogen. The gaseous stream then is divided into approximately equal parts and each part is passed through water and ethyl borate baths, respectively, at room temperature prior to recombination and admission of the stream into the reaction chamber at a flow rate of approximately 1 cubic ft./hr. The stream passes over the wafer heated to a preferred temperature between 800° C. and 900° C. whereupon the ethyl borate decomposes and reacts with the exposed surface of the silicon wafer to form highly doped glass in the source and drain region at a rate of approximately 100 A. per minute. Because the wafer is maintained at a substantially reduced temperature during formation of glass layer 22, instabilities associated with high temperature baking of the substrate are inhibited.

When the wafer forming the field effect transistor of this invention is of p-type conductivity, e.g. doped between $10^{16}$–$10^{17}$ boron atoms per cubic centimeter, a phosphorus doped glass can be deposited atop the exposed source and drain regions by bubbling the mildly oxidizing gaseous stream through a suitable donor impurity e.g. through a solution of ethyl phosphate or phosphorus pentachloride. Similarly, other donor impurities, such as antimony or arsenic, carried by a mildly oxidizing gaseous stream also can be utilized to form source and drain regions in p-type conductivity wafers while conventional acceptor impurities, such as zinc, cadmium or aluminum, can be substituted for boron in the formation of glass layer 22 atop n-type conductivity substrate 12.

After the selective growth of doped glass layer 22 atop the source and drain regions, the 90% nitrogen-10% hydrogen gaseous stream is by-passed from the mild oxidizing agent and the acceptor impurity baths, e.g. by closing valves 30 and 32 after opening valve 34, and the wafer is heated to a temperature in excess of 1000° C. in the flowing reducing atmosphere to diffuse the boron from borosilicate glass layer 22 into the semiconductive wafer thereby forming source and drain regions 36 and 38, respectively, illustrated in FIG. 2E. Because the diffusion is effected at a temperature above 1000° C. tending to produce instabilities in the transistor, the atmosphere employed for diffusion should contain between 2–15% by volume molecular hydrogen in an inert gaseous stream of argon, nitrogen or helium. Instability due to diffusion of boron into the gate oxide also is substantially eliminated by the selective deposition of glass layer 22 only atop the source and drain regions of the silicon wafer.

After diffusion of the boron impurities to a depth between 1 micron and 2.5 microns, electrical contact is made to the gate electrode 16 and source and drain regions 36 and 38 by etching glass layer 22 in "buffered HF" to expose the underlying source and drain regions whereupon a thin film of aluminum is vacuum deposited over the entire surface of the wafer. The aluminum film then is etched utilizing conventional photoresist techniques to remove the aluminum from the wafer at all locations except the source and drain regions and gate electrode permitting individual electrical contact to be made to the aluminum thereby producing the field effect transistor of FIG. 2F. If desired, contact to the base of wafer 12 may be made by alloying the base to a suitable header.

To form complementary transistors on a single monocrystalline n-type silicon wafer 40, as illustrated in FIGS. 4 and 5, the wafer initially is heated in a pure oxygen atmosphere at a temperature in excess of 1000° C. for a period, e.g. 70 hours, to produce an oxide layer 42 of suitable thickness to serve as a shield for subsequent diffusion of an acceptor impurity into the underlying wafer. In general, oxide layer 42 is substantially thicker than 5000 A. and generally is in the order of 10,000 A. The oxide layer then is photoetched, e.g. using conventional photolytic techniques to develop a photoresist mask pattern and immersing the masked structure in a "buffered HF" solution, to form window 44 extending through oxide layer 42 at the location selected for the N-channel complementary transistor as illustrated in FIG. 5A. An acceptor doped insulating layer such as boron doped silicon dioxide glass layer 46 portrayed in FIG. 5B thereupon is deposited over the entire surface of the wafer by pyrolysis of ethyl orthosilicate and triethyl borate in a 10 to 1 volumetric ratio. To accomplish the desired pyrolysis, argon gas is bubbled through ethyl orthosilicate at a rate of .5 cubic foot per hour and through triethyl borate at a rate of 0.05 cubic foot per hour and the resultant vapors are mixed and passed over the silicon wafer at a composite flow rate of 0.55 cubic foot per hour. With the substrate heated to a temperature of 800° C., approximately 10 minutes is sufficient to form a 1000 A. thick layer of boron doped silicon dioxide glass. After deposition of the boron doped glass layer 46, the wafer is heated to a temperature of approximately 1100° C. for approximately 30 hours to cause penetration of the boron atoms into silicon wafer 40 thereby forming p-type conductivity isolation region 48 illustrated in FIG. 5C. If desired, isolation region 48 also could be formed by the selective deposition technique heretofore described with reference to the formation of glass layer 22 of FIG. 2 or by prolonged heating the wafer in an acceptor atmosphere, e.g. heating the wafer for 30 hours in an atmosphere containing boron, zinc or cadmium vapors.

After diffusion of isolation region 48, pyrolytically deposited glass layer 46 and any underlying regions of oxide layer 42 are etched as illustrated in FIG. 5D, e.g. utilizing photoresist and a "buffered HF" etchant, to expose the silicon surface whereat the source, drain and channel of the complementary transistors are to be formed. The structure then is heated at a temperature of approximately 1050° C. for two hours in a pure oxygen stream flowing at a rate of 1 cubic foot per hour to form a high purity gate oxide layer 50 approximately 1200 A. thick atop the exposed silicon surface and a molybdenum film 52, illustrated in FIG. 5E, is deposited atop the gate oxide layer to a thickness of approximately 5000 A. preferably by vacuum evaporation utilizing a pressure of $10^{-6}$ torr and a wafer temperature in excess of 600° C. A layer of photoresist then is applied over the entire structure and the molybdenum film is etched at the source and drain regions of the p-channel transistor as portrayed in FIG. 5F, to form gate electrode 54 by immersion of the photoresist masked structure in a suitable etchant, e.g. an etch comprising 100 cc. of sulfuric acid, 100 cc. of nitric acid, and 300 cc. of water. After removal of the photoresist, the molybdenum gate electrode serves as a shield when the structure is subsequently placed within an R.F. sputtering chamber and the silicon dioxide exposed at the source and drain regions is sputter etched, e.g. utilizing a power input of 200 watts for approximately 10 minutes in a 100 microns argon atmosphere, to expose the silicon surface of wafer 40 at the source and drain regions of the p-channel transistor.

A mildly oxidizing gaseous stream carrying a acceptor impurity then is passed over the wafer heated to a temperature preferably between 800° C. and 900° C. to form a acceptor rich glass only atop the exposed silicon surface of the wafer as shown in FIG. 5G. This may suitably be accomplished by bubbling 50% of a 10% hydrogen-90% nitrogen gaseous stream flowing at a rate of 0.5 cubic foot per hour through a water bath at room temperature to saturate the gaseous stream passing therethrough while 50% of the hydrogen-nitrogen stream is bubbled through an ethyl borate solution to introduce acceptor impurities into the gaseous stream. The stream then is combined and passed over the heated wafer whereupon the ethyl borate decomposes and reacts with the exposed silicon and the water vapor to form a highly doped borosilicate glass layer 53 approximately 1000 A. thick atop the exposed source and drain regions of the p-channel transistor. Because of the very mild oxygen content of the gaseous stream, i.e. approximately 50% humidity at room temperature, molybdenum gate electrode 54 remains substantially unoxidized and there is substantially no deposition of acceptor impurities thereon. The nitrogen-hydrogen gaseous stream then is by-passed from the water and ethyl borate baths and passed directly over the wafer whereupon the wafer is heated to a temperature in excess of 100° C. to diffuse the selectively deposited boron doped glass into source and drain regions 56 and 58 of p-channel transistor 60 as shown in FIG. 5H.

After diffusion of the source and drain regions of transistor 60, photoresist is applied over the entire wafer and source and drain holes 62 and 64 illustrated in FIG. 5I of n-channel transistor 66 are etched (utilizing techniques identical to those described in etching p-channel transistor) thereby forming gate electrode 68 of the n-channel transistor. The photoresist mask then is removed from the structure and a 10% hydrogen, 90% nitrogen gaseous stream 50 saturated with water vapor and ethyl phosphate at room temperature is passed over the wafer heated to approximately 800° C. at the rate of 0.5 cubic foot/hour to selectively grow phosphorus doped glass layer 70, illustrated in FIG. 5J, at the exposed source and drain regions of n-channel transistor 66. A portion of the gaseous stream also reacts with the source and drain regions of p-channel transistor 60 to form a phosphorus doped glass 71 atop previously deposited boron doped glass layer 53. The wafer then is placed in a reducing, e.g. 10% hydrogen-90% nitrogen, atmosphere and baked at a temperature in excess of 1000° C. for approximately two hours to diffuse the phosphorus into source and drain regions 72 and 74, respectively, of n-channel transistor 66 (as shown in FIG. 5K) while producing some compensation in the source and drain regions of p-channel transistor 60. The diffusion time however is regulated to assure that a complete compensation of source and drain regions 56 and 58, respectively, is not effected by the drive-in of the phoshporus into transistor 66. Glass layer 53 atop the source and drain regions of transistor 60 not only serves as a shield to inhibit diffusion of phosphorus from glass 71 into the underlying source and drain regions during drive-in but also serves to impede formation of phosphorus glass atop the source and drain regions of the p-channel transistor during exposure of the wafer to the donor carrying mildly oxidizing gaseous stream.

After diffusion of source and drain regions 72 and 74, respectively, of n-channel transistor 66, contact holes are etched using conventional photolytic techniques and an aluminum film is deposited atop the entire surface of the wafer. The aluminum film then is photolytically etched to remove all the aluminum except for that portion of the aluminum atop the source, drain and gate regions of the semiconductive wafer thereby permitting electrical contact to be made to the regions as shown in FIG. 5L.

While the formation of the source and drain regions of n-channel transistor 66 has been described as being accomplished by the selective growth of a phosphorus glass only at the exposed source and drain regions of wafer 40, these regions also can be formed by pyrolytic deposition of a phosphorus glass over the entire surface of the transistor, e.g. by pyrolysis of ethyl orthosilicate and triethyl phosphate in a 10 to 1 volume ratio as described in heretofore cited U.S. application Ser. No. 679,957 (expressly incorporated herein by reference). Subsequent baking of the phosphorus doped pyrolytic glass coated wafer at temperatures in excess of 1000° C. in a reducing atmosphere during diffusion of source and drain regions 72 and 74, respectively, does not cause instabilities in the formed transistor.

The advantages of utilizing a low temperature selective deposition of a doped glass atop the source and drain regions of a self-registered gate FET may be seen from the following examples:

EXAMPLE 1

A molybdenum/silicon dioxide/silicon varactor (no source and drain present) formed by electron beam evaporation of a molybdenum film atop a silicon dioxide layer thermally grown upon a silicon wafer exhibited a drift of substantially less than 0.5 volt during a stability test wherein capacitance of the varactor was measured against voltage applied between the molybdenum and silicon layers during a temperature cycle of the varactor from room temperature to 300° C. with zero electrical stress and, after 5 minutes at 300° C., back to room temperature with a positive 1 mv./cm. field stress across the oxide. The varactor then was placed in a vacuum chamber and baked for 20 minutes at 1000° C. in a vacuum of $10^{-6}$ torr whereupon the thermal cycle was run under identical conditions. The vacuum-baked varactor exhibited a drift in excess of 10 volts between an unstressed and a positive voltage stressed condition during the thermal cycle. Upon subsequent heat treating the vacuum-baked varactor in a 5% hydrogen-95% helium atmosphere for 30 minutes at 1050° C. and for 15 minutes at 400° C., the varactor exhibited a drift less than 0.5 volts when thermally cycled under identical conditions. Thus, it may be seen that high temperature annealing of a $MO/SiO_2/Si$ structure in vacuum can adversely affect drift while subsequent baking of the structure at a temperature in excess of 1000° C. in a reducing atmosphere tends to return the structure to a stabilized condition.

EXAMPLE 2

A molybdenum/silicon dioxide/silicon varactor having a thermally grown oxide layer of approximately 1200 A. and an electron beam evaporated molybdenum layer of approximately 5000 A. was positioned within a reaction chamber and an approximately 3000 A. layer of boron doped pyrolytic silicon dioxide was deposited over the entire structure by passing a 5% hydrogen-45% nitrogen-50% argon gaseous stream previously bubbled through ethyl orthosilicate and ethyl borate solutions across the varactor heated to a temperature between 700° C. and 800° C. After a subsequent 40-minute anneal of the boron doped glass coated varactor in a 5% hydrogen-95%helium atmosphere at 1050° C., the pyrolytic silicon dioxide was removed and the varactor was thermally cycled from room temperature to 300° C. in an unbiased condition and returned to room temperature after 5 minutes under a positive 1 mv./cm. bias. A drift of approximately 20 volts was observed in the capacitance-voltage curve of the varactor during the thermal cycle. An identical molybdenum/silicon dioxide/silicon structure then was selectively etched at the source and drain regions to expose the underlying silicon water and a thermally grown boron doped oxide was formed only atop the exposed silicon regions utilizing a 5% hydrogen-95% helium gaseous stream 50% saturated at room temperature with both water and ethyl borate. The structure was baked at approximately 1050° C. in a reducing atmosphere of 5% hydrogen-95% helium (free of water vapor and acceptor impurities) whereupon the structure was thermally cycled from room temperature to 300° C. in an unstressed condition and returned to room temperature with a positive voltage stress of 1 mv.cm. A drift of less than 1 volt was observed in the capacitance-voltage curves of the varactor selectively coated with boron containing glass in comparison to the approximately 20-volt drift observed in the varactor having boron containing pyrolytic glass deposited over the gate electrode prior to drive-in.

What we claim as new and desire to secure by Letters Patent of the United States is:

1. A method of forming a self-registered field effect transistor comprising forming a thin, electrically insulating layer atop one major surface of a semiconductive body of first conductivity type, depositing an electrically conductive film atop said electrically insulating layer, said conductive film being of a material nonreactive with said insulating layer at activator-diffusion temperatures, selectively removing said electrically conductive film and underlying insulating layer to expose surface-adjacent regions of said semiconductive body, introducing an activator-inducing impurity into a mildly oxidizing gaseous stream, heating said selectively exposed semiconductive body to a temperature between 700° C. and 1000° C., passing said gaseous stream over said heated semiconductive body to react with said exposed areas of said semiconductive body to form an activator rich glass atop said exposed regions, said gaseous stream being substantially nonreactive with said electrically conductive film at the temperature of said substrate, removing said semiconductive body from said mildly oxidizing gaseous stream and baking said semiconductor body in a reducing atmosphere at temperatures in excess of 1000° C. to diffuse said activator impurity into said semiconductive body to form source and drain regions of opposite conductivity type therein, and making electrical contact to said conductive film and the source and drain regions in said semiconductive body.

2. A method of making a self-registered, field effect transistor according to claim 1 wherein the selective exposure of said semiconductive body is achieved by chemically etching said conductive film and R.F. sputter etching said insulating film exposed by etching said conductive film.

3. A method of making a self-registered, field effect transistor according to claim 1 wherein said semiconductive body is silicon and said reducing atmosphere consists essentially of an inert gas and hydrogen, said hydrogen being present in quantities between 2 and 15% by volume of the inert gas.

4. A method of forming a self-registered, field effect transistor according to claim 1 wherein said semiconductive body is silicon, said conductive film is molybdenum and said mildly oxidizing gaseous stream is an inert gas selected from the group consisting of nitrogen, helium and argon, said selected gas containing an oxidizing agent selected from the group consisting of water vapor, alcohol vapor, carbon monoxide and carbon dioxide in quantities producing an axode layer no greater than 100 A. atop said molybdenum film.

5. A method of forming a self-registered, field effect transistor according to claim 4 wherein said gaseous stream contains between 2–15% by volume hydrogen and said substrate is heated to a temperature between 800° C. and 900° C.

6. A method of forming a self-registered, field effect transistor according to claim 1 wherein said mildly oxidizing gaseous stream is formed by passing an inert gas through a solution of said oxidizing agent at room tempreature.

7. A method of forming a self-registered, field effect transistor according to claim 1 wherein said semiconductive body is silicon, said conductive film is molybdenum and said mildly oxidizing gaseous stream contains an oxidizing agent in quantities producing an oxygen layer no greater than 100° A. atop said molybdenum film while forming a glass layer thicker than 500 A. atop said exposed areas of said semiconductive body.

8. A method of making a complementary pair of self-registered, field effect transistors comprising forming an electrically insulating layer atop one major surface of a semiconductive body of first conductivity type, selectively removing a portion of said insulating layer and diffusing an activator impurity of second conductivity type therethrough to form an isolation region of second conductivity type within said semiconductive body, selectively removing a second portion of said insulating layer to expose a first conductivity type area of said semiconductive substrate, forming a gate insulating layer atop said exposed first conductivity area and said second conductivity region of said semiconductive body, depositing an electrically conductive film selected from the group consisting of molybdenum and tungsten atop said oxide layer, selectively etching said electrically conductive film and said underlying insulating layer to form a gate electrode and expose surface adjacent regions of said first conductivity area, heating said semiconductive body to a temperature between 700° C. and 1000° C., selectively forming activator doped glass only atop said exposed first conductivity area by passing a mildly oxidizing gas containing activator impurities of second conductivity type over said semiconductive body, baking said semiconductive body in a reducing atmosphere at a temperature in excess of 1000° C. to diffuse said activator impurity into said first conductivity area of said semiconductive body thereby forming source and drain regions for a first complementary field effect transistor, selectively etching said electrically conductive film and said underlying insulating layer from atop said second conductivity isolation region to form a gate electrode of a second complementary transistor while exposing surface adjacent regions of said second conductivity region, diffusing an activator impurity of first conductivity type into said second conductivity region of said semiconductive wafer, said first conductivity activator impurity diffusion being insufficient to completely compensate the glass coated source and drain regions of said first complementary field effect transistor, etching the glass coating from the source and drain regions of the first and second complementary field effect transistors to expose the underlying conductivity regions, and making electrical contact to the gate electrodes and source and drain regions of the complementary field effect transistors.

References Cited

UNITED STATES PATENTS

| | | | |
|---|---|---|---|
| 3,320,651 | 5/1967 | Kauppila et al. | 29—571 |
| 3,514,844 | 6/1970 | Bower et al. | 29—571 |
| 3,541,676 | 11/1970 | Brown | 29—571 |

JOHN F. CAMPBELL, Primary Examiner

W. TUPMAN, Assistant Examiner

U.S. Cl. X.R.

29—578; 148—188; 317—235 B